United States Patent
Mori

(10) Patent No.: US 10,281,532 B2
(45) Date of Patent: May 7, 2019

(54) MAGNETIC SENSOR

(71) Applicant: Murata Manufacturing Co., Ltd., Nagaokakyo-shi, Kyoto-fu (JP)

(72) Inventor: Daisuke Mori, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 62 days.

(21) Appl. No.: 15/396,866

(22) Filed: Jan. 3, 2017

(65) Prior Publication Data

US 2017/0108558 A1 Apr. 20, 2017

Related U.S. Application Data

(63) Continuation of application No. PCT/JP2015/068469, filed on Jun. 26, 2015.

(30) Foreign Application Priority Data

Jul. 24, 2014 (JP) ................................. 2014-150816

(51) Int. Cl.
  *G01R 33/09* (2006.01)
  *G01R 33/00* (2006.01)
  *H01L 43/08* (2006.01)

(52) U.S. Cl.
  CPC ......... *G01R 33/09* (2013.01); *G01R 33/0082* (2013.01); *H01L 43/08* (2013.01)

(58) Field of Classification Search
  CPC .......................... G01R 33/09; G01R 33/0082
  See application file for complete search history.

(56) References Cited

U.S. PATENT DOCUMENTS 4,480,248 A * 10/1984 Sudo ..................... H01L 43/08
                                                           257/E43.004
2005/0270018 A1* 12/2005 Tatenuma ............... G01D 5/147
                                                           324/207.21
(Continued)

FOREIGN PATENT DOCUMENTS

JP    48-086765 U1   10/1973
JP    48-098735 A    12/1973
(Continued)

OTHER PUBLICATIONS

Official Communication issued in corresponding Japanese Patent Application No. 2016-535852, dated Jan. 9, 2018.
(Continued)

*Primary Examiner* — Patrick Assouad
*Assistant Examiner* — Haidong Zhang
(74) *Attorney, Agent, or Firm* — Keating & Bennett, LLP

(57) ABSTRACT

A magnetic sensor includes first magnetoresistive elements and second magnetoresistive elements, which define pairs. Rates of change of resistance of the first magnetoresistive elements are higher than rates of change of resistance of the second magnetoresistive elements. The first magnetoresistive elements each include a plurality of first connected patterns along a circumference of an imaginary circle in plan view and arrayed in a circumferential direction or a diameter direction of the imaginary circle. The second magnetoresistive elements are located inside the imaginary circles and are surrounded by the first magnetoresistive elements in plan view.

17 Claims, 13 Drawing Sheets

(56) References Cited

U.S. PATENT DOCUMENTS

| | | | | |
|---|---|---|---|---|
| 2013/0260645 A1* | 10/2013 | Takahashi | ............. | G01N 27/90 |
| | | | | 451/8 |
| 2015/0115949 A1 | 4/2015 | Itagaki | | |
| 2016/0223360 A1* | 8/2016 | Yokotani | ............. | G01D 5/2448 |

FOREIGN PATENT DOCUMENTS

| | | |
|---|---|---|
| JP | 03-282277 A | 12/1991 |
| JP | 06-350159 A | 12/1994 |
| JP | 09-102638 A | 4/1997 |
| JP | 11-274598 A | 10/1999 |
| JP | 2003-282996 A | 10/2003 |
| JP | 2005-351656 A | 12/2005 |
| JP | 2010-008160 A | 1/2010 |
| JP | 2012-088225 A | 5/2012 |
| WO | 2013/171977 A1 | 11/2013 |

OTHER PUBLICATIONS

Official Communication issued in corresponding International Application PCT/JP2015/068469, dated Sep. 29, 2015.

\* cited by examiner

MAGNETIC SENSOR

CROSS REFERENCE TO RELATED APPLICATIONS

This application claims the benefit of priority to Japanese Patent Application No. 2014-150816 filed on Jul. 24, 2014 and is a Continuation Application of PCT Application No. PCT/JP2015/068469 filed on Jun. 26, 2015. The entire contents of each application are hereby incorporated herein by reference.

BACKGROUND OF THE PRESENT INVENTION

1. Field of the Invention

The present invention relates to a magnetic sensor and particularly relates to a magnetic sensor that includes a magnetoresistive element.

2. Description of the Related Art

Japanese Unexamined Patent Application Publication No. 11-274598, Japanese Unexamined Patent Application Publication No. 9-102638, International Publication No. 2013/171977 and Japanese Unexamined Patent Application Publication No. 2012-88225 disclose magnetic sensors that realize an improvement in isotropy in magnetic field detection.

The pattern of a magnetoresistive element of the magnetic sensor disclosed in Japanese Unexamined Patent Application Publication No. 11-274598 has a spiral shape. The two ends of the spiral-shaped pattern are formed at the outermost portions of the pattern located on opposite sides to each other. The pattern of the magnetoresistive element is substantially formed of just curved portions.

A magnetoresistive element of the magnetic sensor disclosed in Japanese Unexamined Patent Application Publication No. 9-102638 has a circular shape formed by being wound through a plurality of turns in a spiral shape, and is formed through film deposition so as to be isotropic with respect to an external magnetic field.

In the magnetic sensor disclosed in International Publication No. 2013/171977, each of a plurality of magnetoresistive elements of a bridge circuit is connected so as to be successively folded back, with plural portions that extend in a direction that is substantially orthogonal to the overall magnetic field direction being arrayed in parallel at prescribed intervals, and each of the plural portions is connected so as to be successively folded back, formed in a zigzag state that is electrically connected, with multiple portions that extend in the magnetic field detection direction being arrayed parallel at prescribed intervals.

The magnetic sensor disclosed in Japanese Unexamined Patent Application Publication No. 2012-88225 is formed by connecting two magnetoresistive elements, which each have a shape formed by continuously connecting semicircular arc-shaped patterns of different diameters, in parallel with each other.

In Japanese Unexamined Patent Application Publication No. 11-274598 and Japanese Unexamined Patent Application Publication No. 9-102638, there is no description or suggestion of forming a magnetic sensor by using a plurality of magnetoresistive elements. In the magnetic sensor disclosed in International Publication No. 2013/171977, since a plurality of patterns having zig-zag shapes are arranged in parallel with each other, there is room for further improvement in terms of reducing the size of the magnetic sensor. In the magnetic sensor disclosed Japanese Unexamined Patent Application Publication No. 2012-88225, wiring lines are routed in three dimensions and the manufacturing process is complex.

SUMMARY OF THE INVENTION

Preferred embodiments of the present invention provide a compact magnetic sensor that is able to be easily manufactured.

A magnetic sensor according to a preferred embodiment of the present invention includes a plurality of magnetoresistive elements that are electrically connected to each other by wiring lines to define a bridge circuit. The plurality of magnetoresistive elements includes a first magnetoresistive element and a second magnetoresistive element, which define a pair. A rate of change of resistance of the first magnetoresistive element is higher than a rate of change of resistance of the second magnetoresistive element. The first magnetoresistive element includes a plurality of first unit patterns that are arranged along a circumference of an imaginary circle in plan view and arrayed in a circumferential direction or a diameter direction of the imaginary circle, the first unit patterns being connected to each other. The second magnetoresistive element is located inside the imaginary circle and is surrounded by the first magnetoresistive element in plan view.

In a preferred embodiment of the present invention, the second magnetoresistive element includes a plurality of second unit patterns that are narrower than the plurality of first unit patterns and that are connected to each other.

In a preferred embodiment of the present invention, the second magnetoresistive element is electrically connected to a wiring line that extends from inside the imaginary circle to outside of the imaginary circle, and the plurality of first unit patterns are positioned along an imaginary C-shape including an open portion, along the circumference of the imaginary circle, in which the wiring line is positioned.

In a preferred embodiment of the present invention, the plurality of magnetoresistive elements includes two pairs of the first magnetoresistive element and the second magnetoresistive element. Circumferential direction orientations of the two first magnetoresistive elements included in the two pairs of the first magnetoresistive element and the second magnetoresistive element are different from each other, and orientations of the imaginary C-shapes are different from each other.

In a preferred embodiment of the present invention, the second magnetoresistive element includes a double-spiral-shaped pattern that includes a double spiral shape in plan view. The double-spiral-shaped pattern includes one spiral-shaped pattern, which is one of the plurality of second unit patterns, another spiral-shaped pattern, which another one of the plurality of second unit patterns, and an S-shaped pattern or a reverse S-shaped pattern that connects the one spiral-shaped pattern and the other spiral-shaped pattern to each other in a central portion of the double-spiral-shaped pattern.

In a preferred embodiment of the present invention, each of the plurality of second unit patterns includes a plurality of bent portions and includes a folded back shape, and does not include a linear extending portion with a length of about 10 µm or more, for example.

In a preferred embodiment of the present invention, the plurality of second unit patterns are semicircular arc-shaped patterns that are line-symmetrically arranged along a circumference of the imaginary circle to be arrayed in a diameter direction of the imaginary circle.

In a preferred embodiment of the present invention, the plurality of second unit patterns are spherical patterns including a diameter of less than about 10 μm, for example.

In a preferred embodiment of the present invention, the plurality of first unit patterns are C-shaped patterns that are arranged along the imaginary C-shape and arrayed in a diameter direction of the imaginary circle.

In a preferred embodiment of the present invention, the plurality of first unit patterns are folded-back-shaped patterns that are arranged in a radiating shape that radiates from the center of the imaginary circle.

According to preferred embodiments of the present invention, a compact magnetic sensor is able to be easily manufactured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
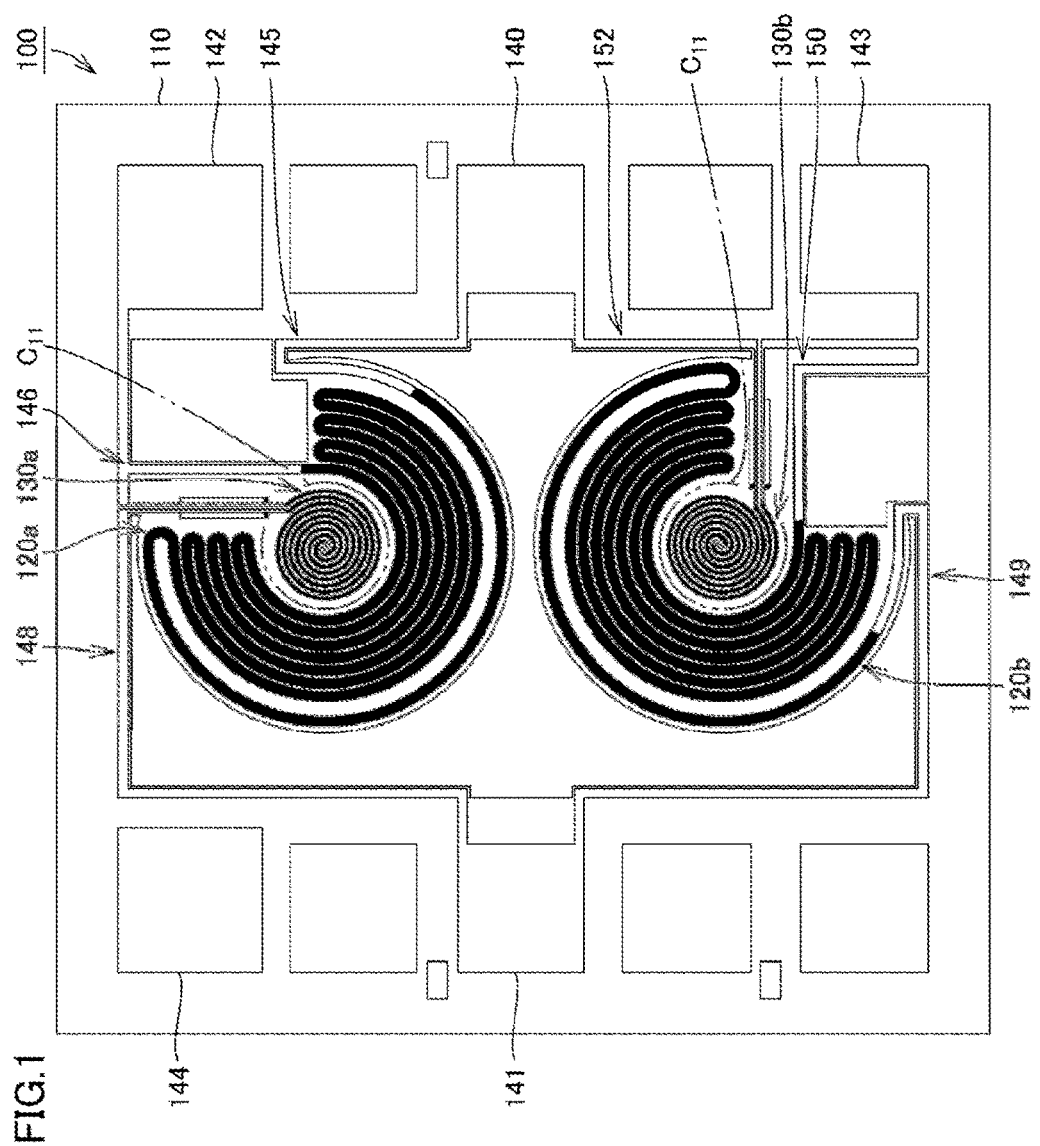
FIG. 1 is a plan view showing the patterns of four magnetoresistive elements that define a bridge circuit of a magnetic sensor according to a first preferred embodiment of the present invention.

Hereafter, magnetic sensors according to preferred embodiments of the present invention are described while referring to the drawings. In the following description of the preferred embodiments, identical or equivalent elements or portions in the drawings are denoted by the same symbols and repeated description thereof is omitted. It is to be noted that the preferred embodiments described in this specification are merely examples, and that the configurations in the preferred embodiments are able to be partly replaced or combined between different preferred embodiments.

First Preferred Embodiment

Figure 2:
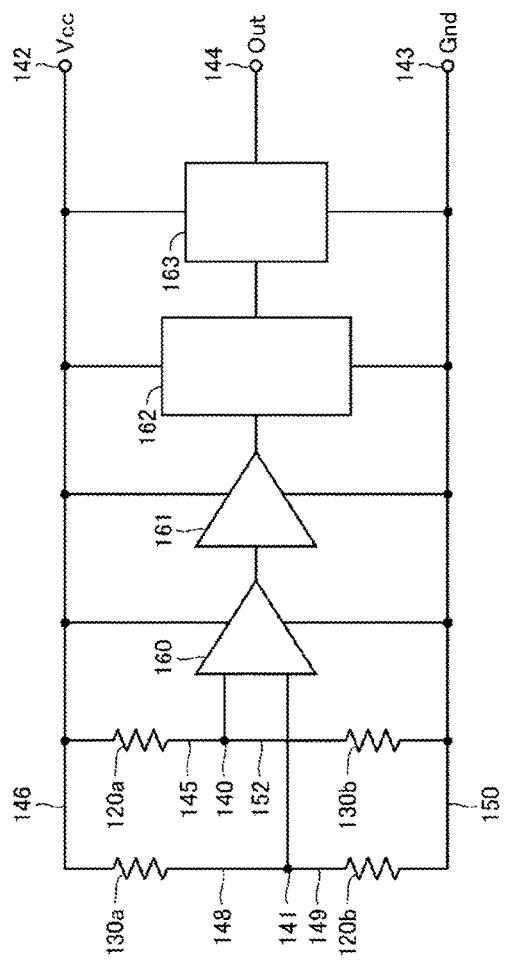
FIG. 2 is an equivalent circuit diagram of the magnetic sensor according to the first preferred embodiment of the present invention.

FIG. 1 is a plan view showing the patterns of four magnetoresistive elements that define a bridge circuit of a magnetic sensor according to a first preferred embodiment of the present invention. FIG. 2 is an equivalent circuit diagram of the magnetic sensor according to the first preferred embodiment.

As shown in FIGS. 1 and 2, a magnetic sensor 100 according to the first preferred embodiment includes four magnetoresistive elements that are electrically connected to each other with wiring lines and define a Wheatstone-bridge-type bridge circuit. The four magnetoresistive elements include two pairs of a first magnetoresistive element and a second magnetoresistive element. Although the magnetic sensor 100 includes two pairs of the first magnetoresistive element and the second magnetoresistive element in the first preferred embodiment, the magnetic sensor 100 is not limited to this configuration and it is sufficient that the magnetic sensor 100 include at least one pair of the first magnetoresistive element and the second magnetoresistive element.

In the two pairs of the first magnetoresistive element and the second magnetoresistive element, the rates of change of resistance of first magnetoresistive elements 120a and 120b are higher than the rates of change of resistance of second magnetoresistive elements 130a and 130b. The first magnetoresistive elements 120a and 120b are magneto-sensitive resistors with electrical resistance values that change in accordance with an externally applied magnetic field. The second magnetoresistive elements 130a and 130b are fixed resistors with electrical resistance values that are constant or substantially constant when an external magnetic field is applied.

The four magnetoresistive elements are electrically connected to each other by wiring lines formed on a substrate 110. Specifically, the first magnetoresistive element 120a and the second magnetoresistive element 130a are electrically connected in series with each other by a wiring line 146. The first magnetoresistive element 120b and the second magnetoresistive element 130b are electrically connected in series with each other by a wiring line 150.

The magnetic sensor 100 includes a midpoint 140, a midpoint 141, a power supply terminal (Vcc) 142, a ground terminal (Gnd) 143, and an output terminal (Out) 144 provided on the substrate 110.

The first magnetoresistive element 120a and the second magnetoresistive element 130b are electrically connected to the midpoint 140. Specifically, the first magnetoresistive element 120a and the midpoint 140 are electrically connected to each other by a wiring line 145 and the second magnetoresistive element 130b and the midpoint 140 are electrically connected to each other by a wiring line 152.

The first magnetoresistive element 120b and the second magnetoresistive element 130a are electrically connected to the midpoint 141. Specifically, the first magnetoresistive element 120b and the midpoint 141 are electrically connected to each other by a wiring line 149 and the second magnetoresistive element 130a and the midpoint 141 are electrically connected to each other by a wiring line 148.

The wiring line 146 is electrically connected to the power supply terminal (Vcc) 142, which receives an input current. The wiring line 150 is electrically connected to the ground terminal (Gnd) 143.

As shown in FIG. 2, the magnetic sensor 100 further includes a differential amplifier 160, a temperature compensation circuit 161, a latch and switch circuit 162, and a complementary metal oxide semiconductor (CMOS) driver 163.

Input terminals of the differential amplifier 160 are electrically connected to the midpoint 140 and the midpoint 141, and an output terminal of the differential amplifier 160 is electrically connected to the temperature compensation circuit 161. In addition, the differential amplifier 160 is electrically connected to the power supply terminal (Vcc) 142 and the ground terminal (Gnd) 143.

An output terminal of the temperature compensation circuit 161 is electrically connected to the latch and switch circuit 162. In addition, the temperature compensation circuit 161 is electrically connected to the power supply terminal (Vcc) 142 and the ground terminal (Gnd) 143.

An output terminal of the latch and switch circuit 162 is electrically connected to the CMOS driver 163. In addition, the latch and switch circuit 162 is electrically connected to the power supply terminal (Vcc) 142 and the ground terminal (Gnd) 143.

An output terminal of the CMOS driver 163 is electrically connected to the output terminal (Out) 144. Furthermore, the CMOS driver 163 is electrically connected to the power supply terminal (Vcc) 142 and the ground terminal (Gnd) 143.

According to the circuit configuration of the magnetic sensor 100 described above, a potential difference, which depends on the strength of an external magnetic field, is generated between the midpoint 140 and the midpoint 141. When this potential difference exceeds a predetermined detection level, a signal is output from the output terminal (Out) 144.

Figure 3:
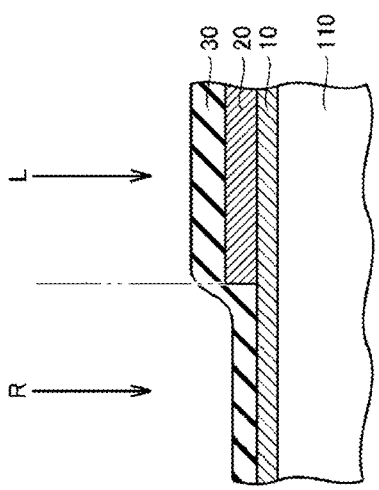
FIG. 3 is a sectional view showing a multilayer structure of a connection portion between a magnetoresistive element and a wiring line in the bridge circuit of the magnetic sensor according to the first preferred embodiment of the present invention.

FIG. 3 is a sectional view showing a multilayer structure of a connection portion between a magnetoresistive element and a wiring line in the bridge circuit of the magnetic sensor according to the first preferred embodiment. Specifically, FIG. 3 shows a connection portion between a region R, which defines and functions as a magnetoresistive element, and a region L, which defines and functions as a wiring line.

As shown in FIG. 3, the four magnetoresistive elements are provided on a substrate 110 that includes Si or the like. A $SiO_2$ layer or a $Si_3N_4$ layer is provided on a surface of the substrate 110. The four magnetoresistive elements are formed preferably by patterning a magnetic layer 10 provided on the substrate 110 by performing milling. The magnetic layer 10 includes an alloy of Ni and Fe.

A wiring line is formed preferably by patterning a conductive layer 20, which is provided above the substrate 110 and includes Au, Al, or the like, by performing wet etching. The conductive layer 20 is located directly above the magnetic layer 10 in the region where the magnetic layer 10 is provided and is located directly above the substrate 110 in the region where the magnetic layer 10 is not provided. Therefore, as shown in FIG. 3, the conductive layer 20 is located directly above the magnetic layer 10 in the connection portion between the region R defining and functioning as the magnetoresistive element and the region L defining and functioning as the wiring line.

The midpoint 140, the midpoint 141, the power supply terminal (Vcc) 142, the ground terminal (Gnd) 143, and the output terminal (Out) 144 are formed by the conductive layer 20 located directly above the substrate 110.

A Ti layer, which is not shown, is provided directly above the conductive layer 20. A protective layer 30, which includes $SiO_2$ or the like, is provided to cover the magnetoresistive element and the wiring line.

Figure 4:
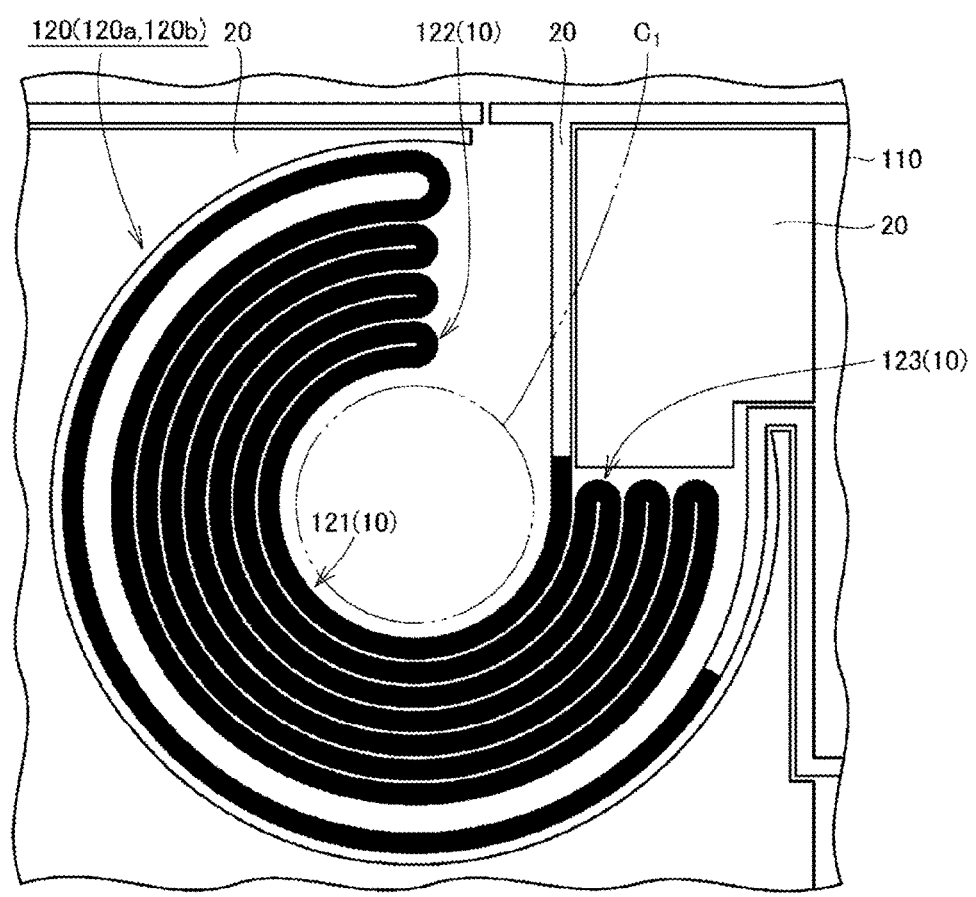
FIG. 4 is a plan view showing the pattern of a first magnetoresistive element of the magnetic sensor according to the first preferred embodiment of the present invention.

FIG. 4 is a plan view showing the pattern of a first magnetoresistive element of the magnetic sensor according to the first preferred embodiment. As shown in FIGS. 1 and 4, a pattern 120 of the first magnetoresistive elements 120a and 120b preferably includes eight first unit patterns that are arranged along the circumference of an imaginary circle $C_1$ in plan view to be arrayed in a diameter direction of the imaginary circle $C_1$, the first unit patterns being connected to each other. The eight first unit patterns are positioned along an imaginary C-shape $C_{11}$ including an open portion in the circumference of the imaginary circle $C_1$ in which the wiring lines 146, 148, 150 and 152 are located. The eight first unit patterns preferably are C-shaped patterns 121 that are arranged along the imaginary C-shape $C_{11}$ to be arrayed in the diameter direction of the imaginary circle $C_1$.

One end of every two C-shaped patterns 121, which are adjacent to or in a vicinity of each other in order from the inner side, are connected to each other by a semicircular arc-shaped pattern 122. The other end of every two C-shaped patterns 121, which are adjacent to or in a vicinity of each other in order from the inner side, are connected to each other by a semicircular arc-shaped pattern 123. The pattern 120 of each of first magnetoresistive elements 120a and 120b includes four semicircular arc-shaped patterns 122 and three semicircular arc-shaped patterns 123. The eight C-shaped patterns 121 are thus connected in series with each other. The semicircular arc-shaped patterns 122 and 123 do not include any linear extending portions and include only curved portions.

As shown in FIG. 1, the two first magnetoresistive elements 120a and 120b include different orientations in the circumferential direction. Accordingly, the orientations of the imaginary C-shapes $C_{11}$ are different from each other. That is, the circumferential direction orientations of the patterns 120 of the 2 first magnetoresistive elements 120a and 120b are different from each other, and the orientations of the C-shaped patterns 121 are different from each other.

In the first preferred embodiment, the circumferential direction orientations of the patterns 120 of the two first magnetoresistive elements 120a and 120b differ by about 90°, and the orientations of the C-shaped patterns 121 differ by about 90°.

Figure 5:
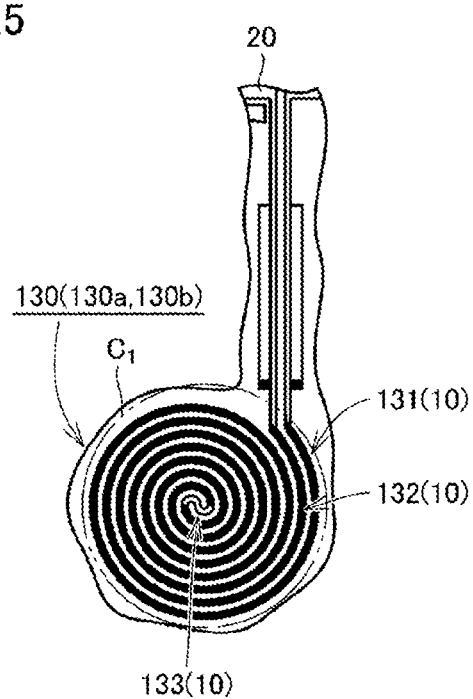
FIG. 5 is a plan view showing the pattern of a second magnetoresistive element of the magnetic sensor according to the first preferred embodiment of the present invention.

FIG. 5 is a plan view showing the pattern of a second magnetoresistive element of the magnetic sensor according to the first preferred embodiment. As shown in FIGS. 1 and 5, the second magnetoresistive elements 130a and 130b are located inside the imaginary circles $C_1$ in plan view and are surrounded by the first magnetoresistive elements 120a and 120b. The second magnetoresistive elements 130a and 130b are electrically connected to the wiring lines 146, 148, 150 and 152, which extend from the inside the imaginary circles $C_1$ to outside the imaginary circles $C_1$. The second magnetoresistive elements 130a and 130b each include a double-spiral-shaped pattern 130, which includes a double spiral shape in plan view.

The double-spiral-shaped pattern 130 includes one spiral-shaped pattern 131, which is one of two second unit patterns, another spiral-shaped pattern 132, which is the other one of the two second unit patterns, and a reverse S-shaped pattern 133 that connects the one spiral-shaped pattern 131 and the other spiral-shaped pattern 132 to each other in a central portion of the double-spiral-shaped pattern 130. The reverse S-shaped pattern 133 does not include any linear extending portions and includes only curved portions.

The double-spiral-shaped pattern 130 includes a narrower pattern than the pattern 120. Therefore, the one spiral-shaped pattern 131 and the other spiral-shaped pattern 132 are narrower than the eight C-shaped patterns 121.

As shown in FIG. 5, the double-spiral-shaped pattern 130 includes a shape that point symmetrical or substantially point symmetrical about the center of the imaginary circle $C_1$. That is, the double-spiral-shaped pattern 130 includes about 180° rotational symmetry about the center of the imaginary circle $C_1$.

As shown in FIG. 1, the double-spiral-shaped patterns 130 of the two second magnetoresistive elements 130a and 130b include different orientations in the circumferential direction, and the orientations of the reverse S-shaped patterns 133 thereof are different from each other.

In the first preferred embodiment, the circumferential direction orientations of the double-spiral-shaped patterns 130 of the two second magnetoresistive elements 130a and 130b differ by about 90°, and the orientations of the reverse S-shaped patterns 133 thereof differ by about 90°.

The electrical resistance value of a magnetoresistive element changes due to the magnetoresistive effect when a magnetic field is applied at a specific angle with respect to the direction in which a current flows through the magnetoresistive element. The magnetoresistive effect becomes stronger as the length of a magnetoresistive element in the longitudinal direction thereof increases.

Therefore, according to the above-described patterns of the second magnetoresistive elements 130a and 130b, the magnetoresistive effects of the second magnetoresistive elements 130a and 130b are significantly reduced or prevented and the rates of change of resistance of the second magnetoresistive elements 130a and 130b are very small, as described below.

Figure 6:
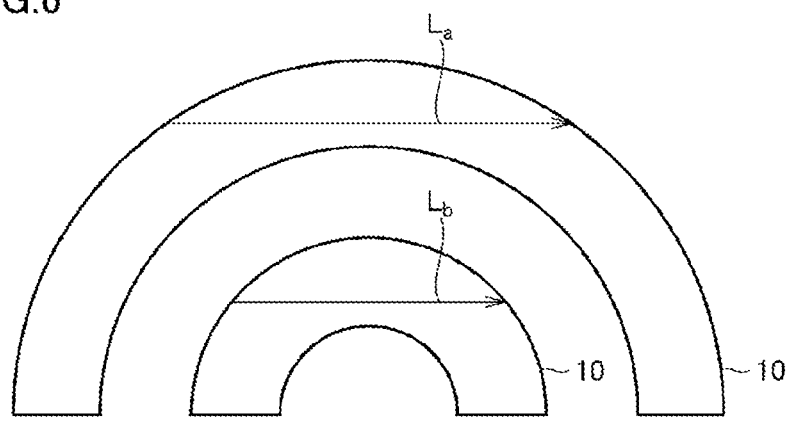
FIG. 6 is a plan view showing two semicircular arc-shaped patterns arranged concentrically.

FIG. 6 is a plan view showing two semicircular arc-shaped patterns arranged concentrically. As shown in FIG. 6, a length $L_b$, which is located on a straight line in the semicircular arc-shaped pattern positioned on the inside, is smaller than a length $L_a$, which is located on a straight line in the semicircular pattern positioned on the outside. Accordingly, the magnetoresistive effect of the semicircular arc-shaped pattern positioned on the inside is smaller than the magnetoresistive effect of the semicircular arc-shaped pattern positioned on the outside.

Therefore, the magnetoresistive effects of the second magnetoresistive elements 130a and 130b, which are positioned inside the first magnetoresistive elements 120a and 120b, are smaller than the magnetoresistive effects of the first magnetoresistive elements 120a and 120b. As described above, in the first preferred embodiment, the double-spiral-shaped patterns 130 of the second magnetoresistive elements 130a and 130b include patterns that are narrower than the patterns 120 of the first magnetoresistive elements 120a and 120b. Therefore, the magnetoresistive effects of the second magnetoresistive elements 130a and 130b become further smaller than the magnetoresistive effects of the first magnetoresistive elements 120a and 120b. Accordingly, the magnetoresistive effects of the second magnetoresistive elements 130a and 130b are significantly reduced or prevented and the rates of change of resistance of the second magnetoresistive elements 130a and 130b are very small.

In the magnetic sensor 100 according to the first preferred embodiment, the first magnetoresistive elements 120a and 120b each include C-shaped patterns 121. The C-shaped patterns 121 include circular arcs. Every two adjacent or neighboring C-shaped patterns 121 are connected to each other by the semicircular arc-shaped patterns 122 and 123. Thus, since the first magnetoresistive elements 120a and 120b do not include any linear extending portions, the anisotropy of magnetic field detection is significantly reduced or prevented.

In addition, in the magnetic sensor 100 according to the first preferred embodiment, the patterns 120 include different circumferential direction orientations from each other. Accordingly, the orientations of the C-shaped patterns 121 of the two first magnetoresistive elements 120a and 120b are different from each other and the isotropy of magnetic field detection is improved.

In the magnetic sensor 100 according to the first preferred embodiment, the second magnetoresistive elements 130a and 130b each include a double-spiral-shaped pattern 130. The double-spiral-shaped pattern 130 is formed preferably by winding substantially circular arc-shaped curved portions. Since the circular arcs include approximate shapes that are provided when the number of corners of a polygonal shape increases toward infinity, the direction of the current flowing through the double-spiral-shaped pattern 130 varies across substantially all horizontal directions. The horizontal directions are directions that are parallel or substantially parallel to the surface of the substrate 110.

In addition, in the magnetic sensor 100 according to the first preferred embodiment, the central portion of the double-spiral-shaped pattern 130 includes the reverse S-shaped pattern 133 that includes by only curved portions. Thus, since the second magnetoresistive elements 130a and 130b do not include any linear extending portions, the anisotropy of the magnetoresistive effect is significantly reduced or prevented.

Furthermore, in the magnetic sensor 100 according to the first preferred embodiment, the double-spiral-shaped patterns 130 include different circumferential direction orientations from each other, and the reverse S-shaped patterns 133 of the two second magnetoresistive elements 130a and 130b include different orientations from each other. Accordingly, as discussed below, the isotropy of the magnetoresistive effect is improved.

As described above, the double-spiral-shaped pattern 130 includes about 180° rotational symmetry about the center of the imaginary circle $C_1$. Therefore, the magnetoresistive effects of the two second magnetoresistive elements 130a and 130b provide little anisotropy.

Accordingly, the anisotropies of the magnetoresistive effects of the second magnetoresistive elements 130a and 130b are able to significantly reduce or cancel each other by making the double-spiral-shaped pattern 130 of the second magnetoresistive element 130a and the double-spiral-shaped pattern 130 of the second magnetoresistive element 130b include different circumferential direction orientations.

The anisotropies of the magnetoresistive effects of the second magnetoresistive elements 130a and 130b are able to significantly reduce or cancel each other to a significantly increased or maximum extent by setting the circumferential direction orientations of the double-spiral-shaped pattern 130 of the second magnetoresistive element 130a and the double-spiral-shaped pattern 130 of the second magnetoresistive element 130b to differ by about 90°, for example.

In this case, the direction in which the second magnetoresistive element 130a has the highest sensitivity and the direction in which the second magnetoresistive element 130b has the lowest sensitivity are the same or substantially the same, and the direction in which the second magnetoresistive element 130a has the lowest sensitivity and the direction in which the second magnetoresistive element 130b has the highest sensitivity are the same or substantially the same. Therefore, variations that occur in the potential difference generated between the midpoint 140 and the midpoint 141 when an external magnetic field is applied to the magnetic sensor 100 are able to be significantly reduced or prevented, the variations depending upon the direction in which the external magnetic field is applied to the magnetic sensor 100.

The shape of the double-spiral-shaped pattern 130 provides a high density per unit area. According to the double-spiral-shaped pattern 130 of each of the second magnetoresistive elements 130a and 130b, the resistances of the second magnetoresistive elements 130a and 130b are able to be increased by increasing the length of the pattern arranged inside the imaginary circle $C_1$. The higher the electrical resistance values of the second magnetoresistive elements 130a and 130b are, the more the current consumption of the magnetic sensor 100 is able to be reduced.

As described above, the anisotropy of the magnetoresistive effect of the two second magnetoresistive elements 130a and 130b is significantly reduced or prevented by the direction of the current that flows through the double-spiral-shaped pattern 130 varying across the horizontal directions, and as a result, variations in the output of the magnetic sensor 100 that occur when the external magnetic field is zero are able to be significantly reduced or prevented, the variations being caused by the effect of residual magnetization.

The double-spiral-shaped pattern 130 may be wound in the opposite direction and, in this case, the central portion of the double-spiral-shaped pattern 130 includes an S-shaped pattern with only curved portions. That is, one spiral-shaped pattern and another spiral-shaped pattern would be connected to each other by an S-shaped pattern.

Figure 7:
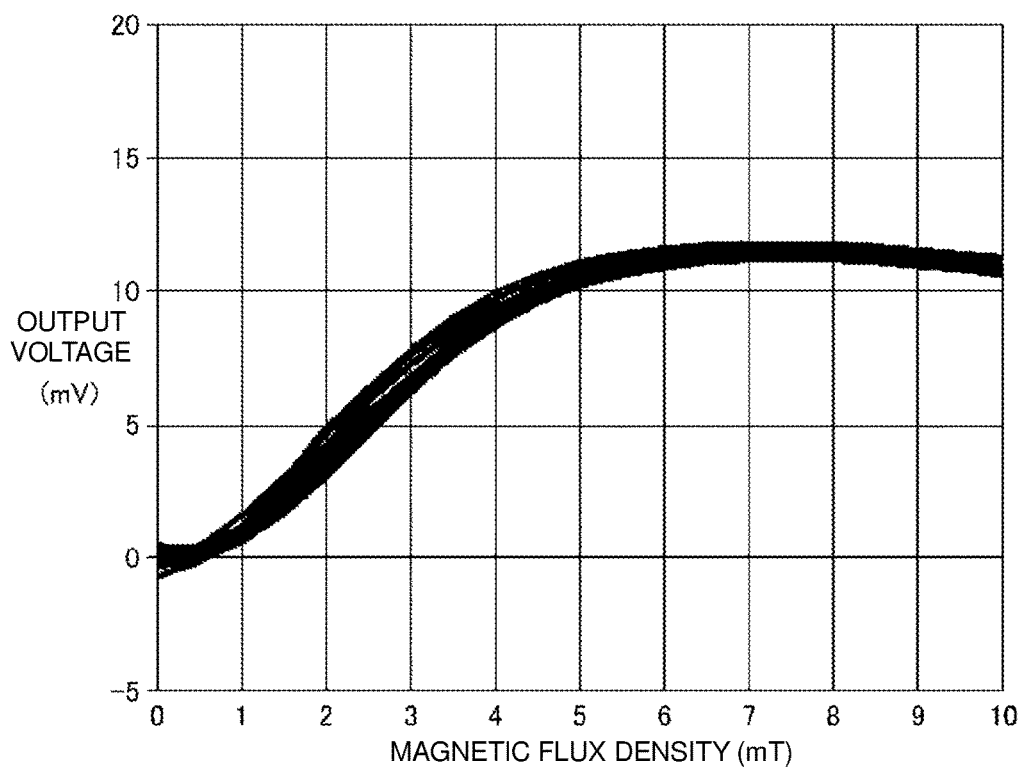
FIG. 7 is a graph showing the results of an experiment in which the direction in which an external magnetic field was applied to the magnetic sensor according to the first preferred embodiment of the present invention among horizontal directions was changed from about 0° to about 337.5° at intervals of about 22.5° and the relationship between the strength of the external magnetic field and the output of the magnetic sensor was determined.

FIG. 7 is a graph showing the results of an experiment in which the direction in which an external magnetic field was applied to the magnetic sensor according to the first preferred embodiment among the horizontal directions was changed from about 0° to about 337.5° at intervals of about 22.5°, and the relationship between the strength of the external magnetic field and the output of the magnetic sensor was determined. In FIG. 7, the output voltage (mV) of the magnetic sensor is represented along the vertical axis and the magnetic flux density (mT) is represented along the horizontal axis.

As shown in FIG. 7, in the magnetic sensor 100 according to the first preferred embodiment, a significant change in the relationship between the strength of the external magnetic field and the output of the magnetic sensor 100 could not be observed, even when the direction in which the external magnetic field was applied among horizontal directions was changed from about 0° to about 337.5° at intervals of about 22.5°. That is, it was confirmed that the magnetic sensor 100 according to the first preferred embodiment provides improved isotropy in magnetic field detection. In addition, it was also confirmed that variations in the output of the magnetic sensor 100 that occur when the external magnetic field is zero are significantly reduced or prevented.

Since the second magnetoresistive elements 130a and 130b are arranged inside the first magnetoresistive elements 120a and 120b in the magnetic sensor 100 according to the first preferred embodiment, the magnetic sensor 100 is able to be made compact. In addition, since there is no need to route the wiring lines that electrically connect the first magnetoresistive elements 120a and 120b and the second magnetoresistive elements 130a and 130b to each other in three dimensions in the magnetic sensor 100, the magnetic sensor 100 is able to be manufactured by a simple manufacturing process.

Second Preferred Embodiment

Hereafter, a magnetic sensor according to a second preferred embodiment of the present invention is described while referring to the drawings. The magnetic sensor according to the second preferred embodiment mainly differs from the magnetic sensor 100 according to the first preferred embodiment with respect to the patterns of the first magnetoresistive elements and the second magnetoresistive elements and, therefore, repeated description of the remaining elements and features is omitted.

Figure 8:
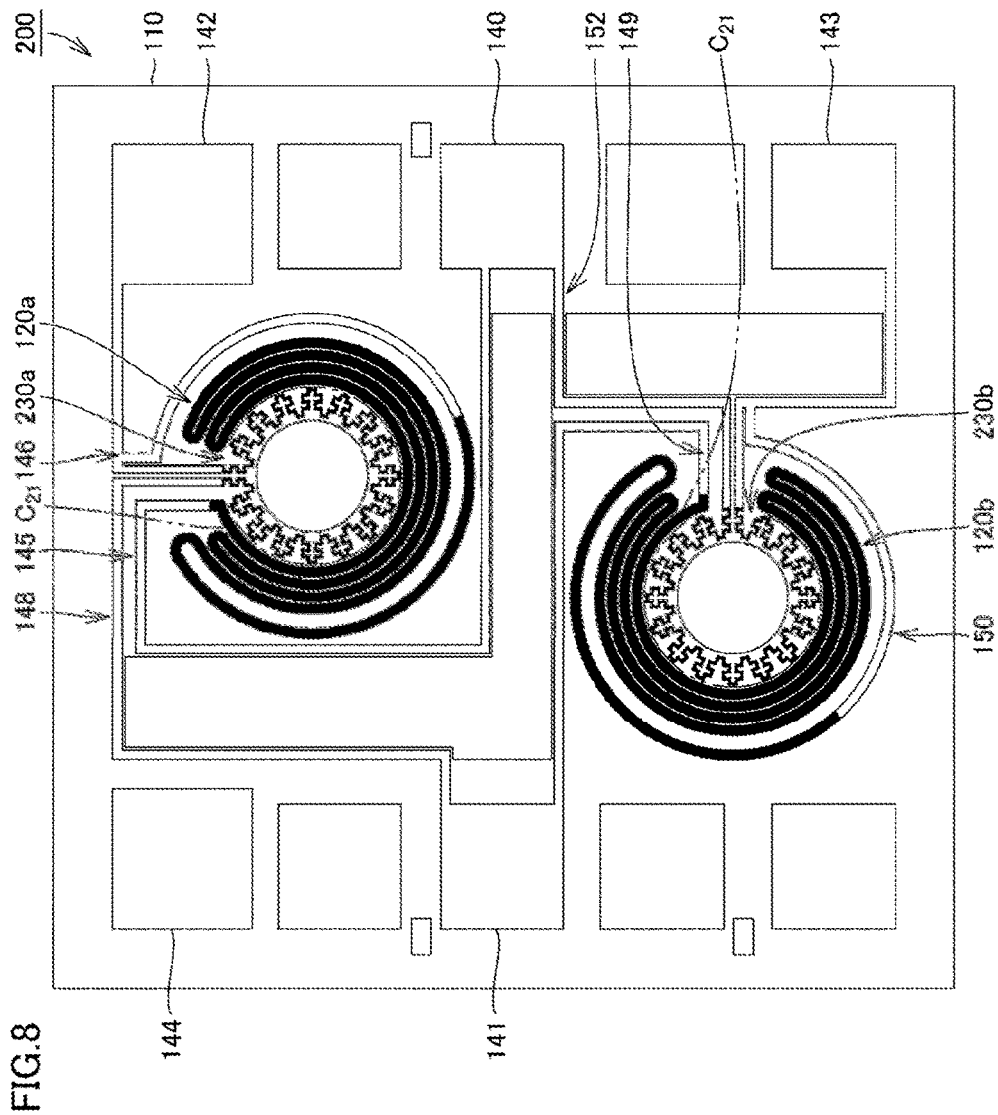
FIG. 8 is a plan view showing the patterns of four magnetoresistive elements that define a bridge circuit of a magnetic sensor according to a second preferred embodiment of the present invention.
Figure 9:
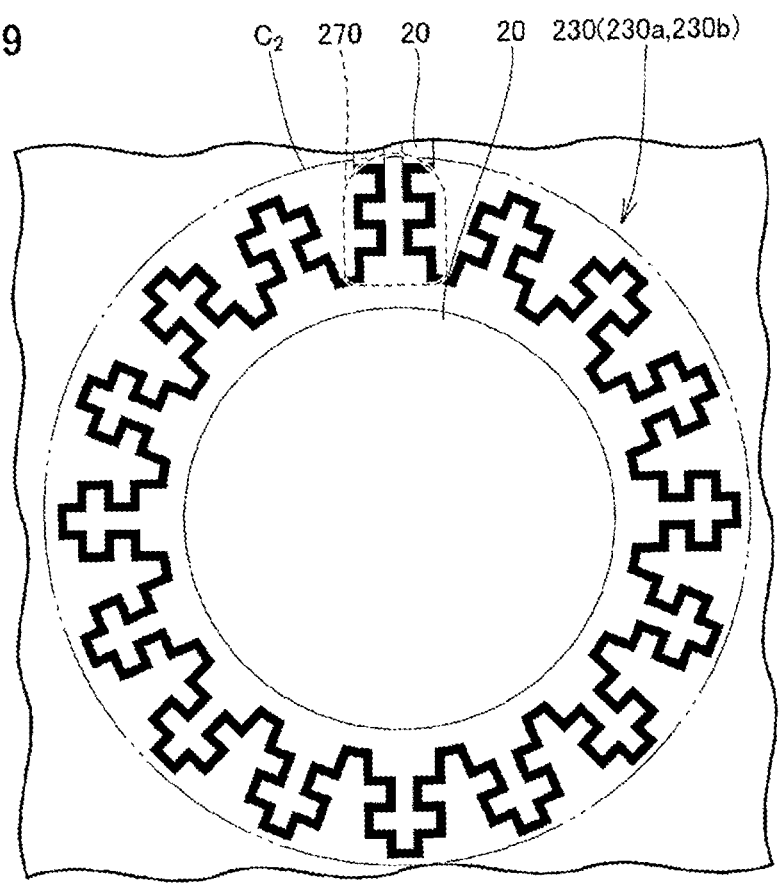
FIG. 9 is a plan view showing the pattern of a second magnetoresistive element of the magnetic sensor according to the second preferred embodiment of the present invention.
Figure 10:
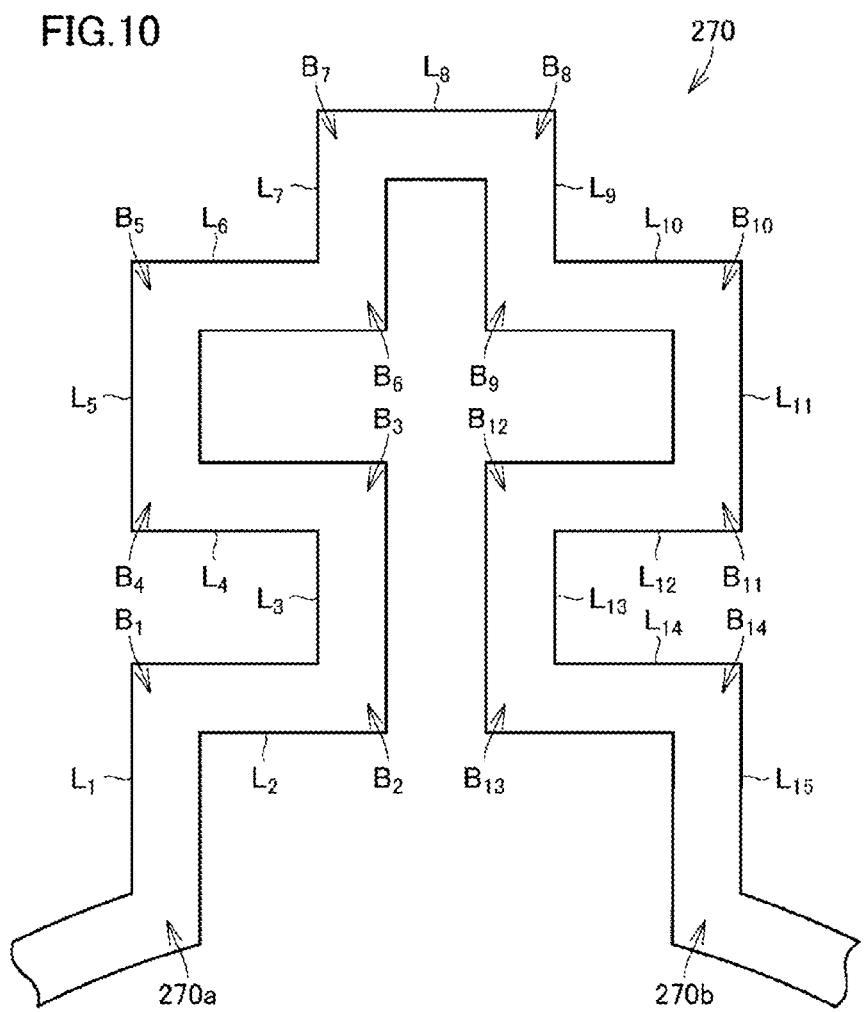
FIG. 10 is a plan view showing a unit pattern included in the pattern of the second magnetoresistive element of the magnetic sensor according to the second preferred embodiment of the present invention.

FIG. 8 is a plan view showing the patterns of four magnetoresistive elements that define a bridge circuit of a magnetic sensor according to the second preferred embodiment. FIG. 9 is a plan view showing the pattern of a second magnetoresistive element of the magnetic sensor according to the second preferred embodiment. FIG. 10 is a plan view showing a unit pattern included in the pattern of the second magnetoresistive element of the magnetic sensor according to the second preferred embodiment.

As shown in FIGS. 8 and 9, the patterns of first magnetoresistive elements 120a and 120b of a magnetic sensor 200 according to the second preferred embodiment includes five first unit patterns that are arranged along the circumference of an imaginary circle $C_2$ in plan view. The unit patterns are arrayed in a diameter direction of the imaginary circle $C_2$, the first unit patterns being connected to each other. The five first unit patterns are positioned along an imaginary C-shape $C_{21}$ including an open portion, in the circumference of the imaginary circle $C_2$, in which the wiring lines 146, 148, 150 and 152 are located. The five first unit patterns are C-shaped patterns that are arranged along the imaginary C-shape $C_{21}$ to be arrayed in the diameter direction of the imaginary circle $C_2$.

As shown in FIG. 8, the two first magnetoresistive elements 120*a* and 120*b* include different orientations in the circumferential direction. Accordingly, the imaginary C-shapes $C_{21}$ include different orientations from each other. That is, the circumferential direction orientations of the patterns of the two first magnetoresistive elements 120*a* and 120*b* are different from each other, and the orientations of the C-shaped patterns are different from each other.

In the second preferred embodiment, the circumferential direction orientations of the patterns of the two first magnetoresistive elements 120*a* and 120*b* differ by about 90°, and the orientations of the C-shaped patterns differ by about 90°, for example.

Second magnetoresistive elements 230*a* and 230*b* of the magnetic sensor 200 according to the second preferred embodiment each include a pattern 230 that includes sixteen folded-back second unit patterns 270 that each include a plurality of bent portions. The pattern 230 includes a pattern that is narrower than the pattern of the first magnetoresistive elements 120*a* and 120*b*.

As shown in FIG. 9, the sixteen second unit patterns 270 are arranged along the circumference of the imaginary circle $C_2$ to be arrayed in the circumferential direction of the imaginary circle $C_2$ and are connected to each other. As shown in FIG. 10, each second unit pattern 270 is folded back on itself in a region between a start end portion 270*a* and a finish end portion 270*b* and includes fourteen bent portions $B_1$ to $B_{14}$ and fifteen linear extending portions $L_1$ to $L_{15}$. That is, the second unit pattern 270 includes a bag shape with the start end portion 270*a* and the finish end portion 270*b* being open ends.

In the second preferred embodiment, the second unit pattern 270 is bent at right angles or substantially right angles in each of the fourteen bent portions $B_1$ to $B_{14}$. The second unit pattern 270 does not include any linear extending portions with a length of about 10 μm or longer, for example. That is, the lengths of all fifteen linear extending portions $L_1$ to $L_{15}$ are smaller than about 10 μm, for example.

Thus, the anisotropy of the magnetoresistive effect of the second magnetoresistive elements 230*a* and 230*b* is able to be significantly reduced or prevented by the direction of a current flowing through the second unit pattern 270 varying the horizontal directions. In addition, variations in the output of the magnetic sensor 200 that occur when the external magnetic field is zero are able to be significantly reduced or prevented, the variations being caused by the effect of residual magnetization.

In addition, the anisotropy of the magnetoresistive effect of the second magnetoresistive elements 230*a* and 230*b* is able to be significantly reduced or prevented by the direction of the current that flows through the pattern 230 varying across the horizontal directions by arranging the plurality of second unit patterns 270 along the circumference of the imaginary circle $C_2$.

However, the patterns of the second magnetoresistive elements 230*a* and 230*b* are not limited to those described above and it is sufficient that the patterns do not include linear extending portions including a length of about 10 μm or longer, for example, and include a plurality of second unit patterns that are folded back. For example, the second unit patterns 270 may be curved in fourteen bent portions $B_1$ to $B_{14}$. In this case, the anisotropy of the magnetoresistive effect of the second magnetoresistive elements 230*a* and 230*b* is able to be further reduced by varying, across the horizontal directions, the direction of a current that flows through the second unit pattern 270.

The patterns 230 of the two second magnetoresistive elements 230*a* and 230*b* include different orientations from each other in the circumferential direction. In the second preferred embodiment, the circumferential direction orientations of the patterns 230 of the two second magnetoresistive elements 230*a* and 230*b* differ by about 90°, for example. Therefore, the anisotropies of the magnetoresistive effects of the two second magnetoresistive elements 230*a* and 230*b* are able to significantly reduce or cancel each other.

Since the second magnetoresistive elements 230*a* and 230*b* are arranged inside the first magnetoresistive elements 120*a* and 120*b* in the magnetic sensor 200 according to the second preferred embodiment, the magnetic sensor 200 is able to be made compact. In addition, since there is no need to route the wiring lines that electrically connect the first magnetoresistive elements 120*a* and 120*b* and the second magnetoresistive elements 230*a* and 230*b* to each other in three dimensions in the magnetic sensor 200 as well, the magnetic sensor 200 is able to be manufactured by a simple manufacturing process.

Third Preferred Embodiment

Hereafter, a magnetic sensor according to a third preferred embodiment of the present invention is described while referring to the drawings. The magnetic sensor according to the third preferred embodiment mainly differs from the magnetic sensor 100 according to the first preferred embodiment with respect to the patterns of the first magnetoresistive elements and the second magnetoresistive elements and, therefore, repeated description of the remaining elements and features is omitted.

Figure 11:
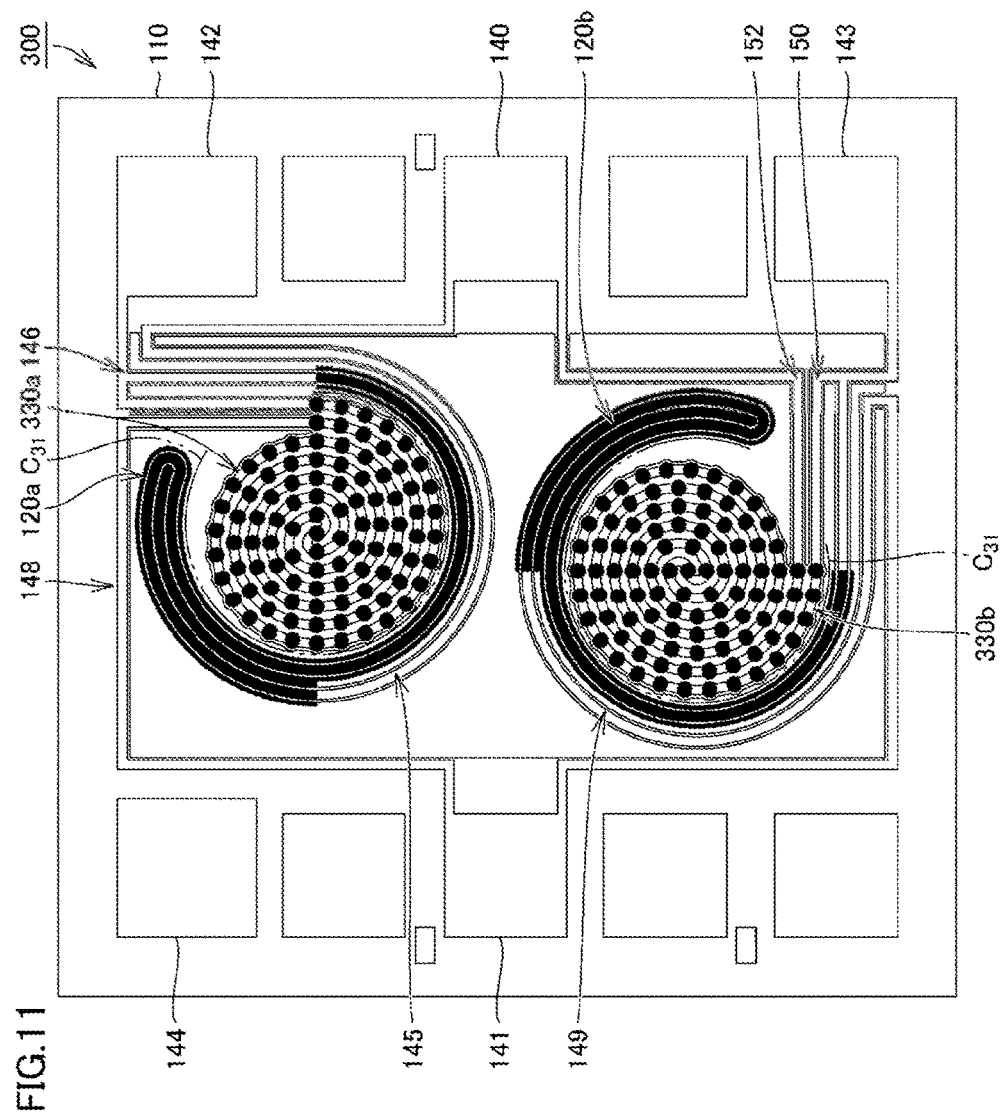
FIG. 11 is a plan view showing the patterns of four magnetoresistive elements that define a bridge circuit of a magnetic sensor according to a third preferred embodiment of the present invention.
Figure 12:
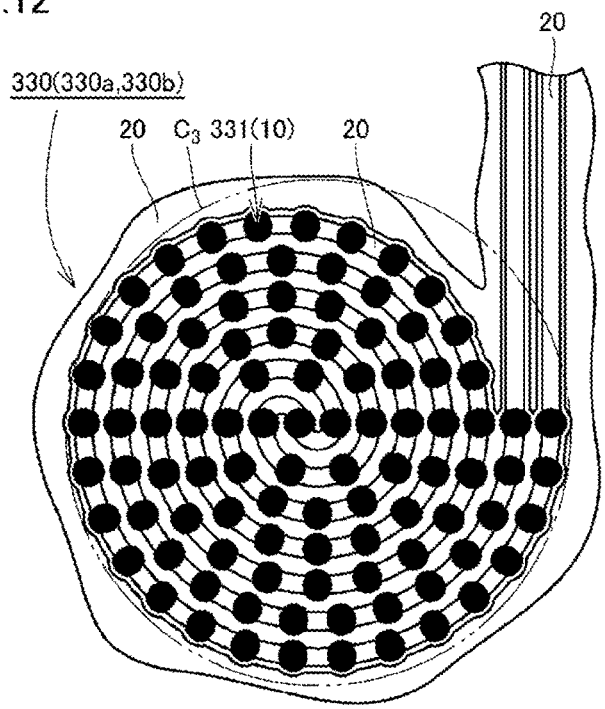
FIG. 12 is a plan view showing the pattern of a second magnetoresistive element of the magnetic sensor according to the third preferred embodiment of the present invention.

FIG. 11 is a plan view showing the patterns of four magnetoresistive elements that define a bridge circuit of a magnetic sensor according to the third preferred embodiment. FIG. 12 is a plan view showing the pattern of a second magnetoresistive element of the magnetic sensor according to the third preferred embodiment.

As shown in FIGS. 11 and 12, the patterns of first magnetoresistive elements 120*a* and 120*b* of a magnetic sensor 300 according to the third preferred embodiment each include two first unit patterns that are arranged along the circumference of an imaginary circle $C_3$ in plan view. The unit patterns are arrayed in a diameter direction of the imaginary circle $C_3$, the first unit patterns being connected to each other. The two first unit patterns are positioned along an imaginary C-shape $C_{31}$ including an open portion, along the circumference of the imaginary circle $C_3$, in which the wiring lines 146, 148, 150, and 152 are located. The two first unit patterns are C-shaped patterns that are arranged along the imaginary C-shape $C_{31}$ to be arrayed in the diameter direction of the imaginary circle $C_3$.

As shown in FIG. 11, the two first magnetoresistive elements 120*a* and 120*b* include different orientations in circumferential direction. Accordingly, the orientations of the imaginary C-shapes $C_{31}$ are different from each other. That is, the circumferential direction orientations of the patterns of the two first magnetoresistive elements 120*a* and 120*b* are different from each other, and the orientations of the C-shaped patterns are different from each other.

In the third preferred embodiment, the circumferential direction orientations of the patterns of the two first magnetoresistive elements 120*a* and 120*b* differ by about 90°, and the orientations of the C-shaped patterns differ by about 90°, for example.

Second magnetoresistive elements 330*a* and 330*b* of the magnetic sensor 300 according to the third preferred embodiment each include a pattern 330 that includes a plurality of second unit patterns. The plurality of second unit patterns includes spherical patterns 331 with a diameter of less than about 10 μm, for example. The plurality of spherical patterns 331 are arrayed in a double spiral shape with spaces therebetween. The plurality of spherical patterns 331 are electrically connected to each other by wiring lines. The spaces between the spherical patterns 331 are preferably as small as possible. The diameter dimension of each of the plurality of spherical patterns 331 is smaller than the width dimension of the patterns of the first magnetoresistive elements 120*a* and 120*b*.

Since the length of each spherical pattern 331 along a straight line is the same or substantially the same in all horizontal directions, the pattern 330 includes a plurality of spherical patterns 331 with a diameter of less than about 10 μm, for example. Accordingly, the anisotropies of the magnetoresistive effects of the second magnetoresistive elements 330*a* and 330*b* are able to be reduced. Furthermore, the direction in which a current flows through the spherical patterns 331 is able to vary throughout substantially all horizontal directions by arranging the plurality of spherical patterns 331 to be arrayed in a double spiral shape.

As described above, the anisotropy of the magnetoresistive effect of the second magnetoresistive elements 330*a* and 330*b* is significantly reduced or canceled by the direction of the current that flows through the pattern 330 varying across the horizontal directions. Accordingly, variations in the output of the magnetic sensor 300 that occur when the external magnetic field is zero are able to be significantly reduced or prevented, the variations being caused by the effect of residual magnetization.

The patterns 330 of the two second magnetoresistive elements 330*a* and 330*b* include different circumferential direction orientations from each other. In the third preferred embodiment, the circumferential direction orientations of the patterns 330 of the two second magnetoresistive elements 330*a* and 330*b* differ by about 90°, for example. Therefore, the anisotropies of the magnetoresistive effects of the two second magnetoresistive elements 330*a* and 330*b* are able to significantly reduce or cancel each other.

Figure 13:
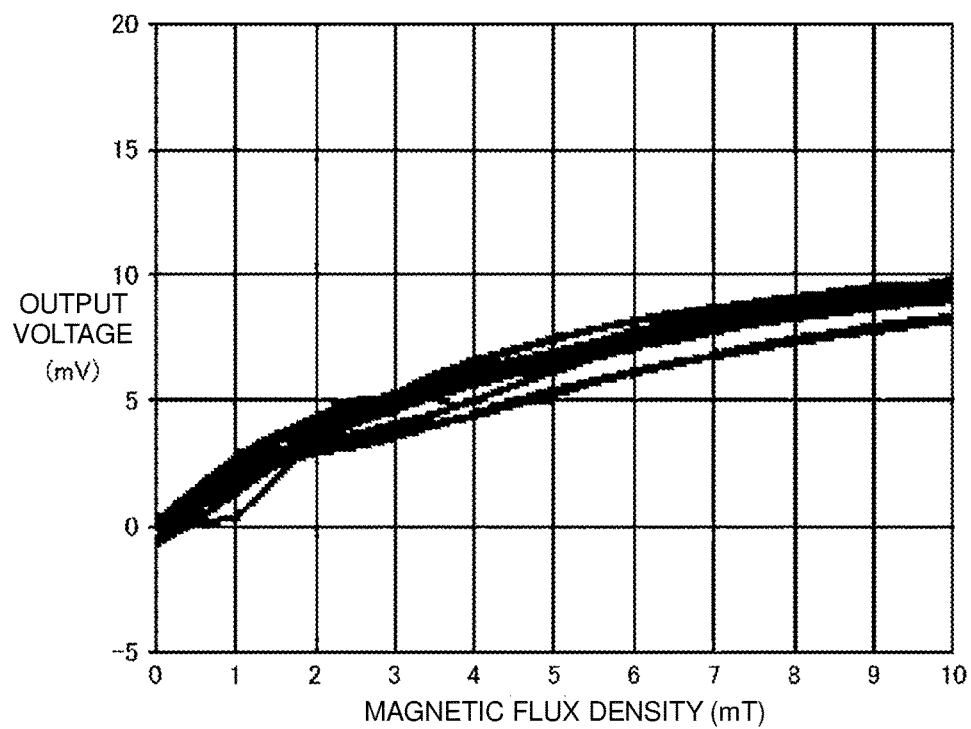
FIG. 13 is a graph showing the results of an experiment in which the direction in which an external magnetic field was applied to the magnetic sensor according to the third preferred embodiment of the present invention among horizontal directions was changed from about 0° to about 337.5° at intervals of about 22.5° and the relationship between the strength of the external magnetic field and the output of the magnetic sensor was determined.

FIG. 13 is a graph showing the results of an experiment in which the direction in which an external magnetic field was applied to the magnetic sensor according to the third preferred embodiment among the horizontal directions was changed from about 0° to about 337.5° at intervals of about 22.5° and the relationship between the strength of the external magnetic field and the output of the magnetic sensor was determined. In FIG. 13, the output voltage (mV) of the magnetic sensor is represented along the vertical axis and the magnetic flux density (mT) is represented along the horizontal axis.

As shown in FIG. 13, in the magnetic sensor 300 according to the third preferred embodiment, a significant change in the relationship between the strength of the external magnetic field and the output of the magnetic sensor 300 could not be observed, even when the direction in which the external magnetic field was applied among the horizontal directions was changed from about 0° to about 337.5° at intervals of about 22.5°. That is, it was confirmed that the magnetic sensor 300 according to the third preferred embodiment provides improved isotropy in magnetic field detection. In addition, it was also confirmed that variations in the output of the magnetic sensor 300 that occur when the external magnetic field is zero are significantly reduced or prevented. In addition, in the magnetic sensor 300 according to the third preferred embodiment, it was confirmed that the strength of the external magnetic field and the output of the magnetic sensor 300 are linearly proportional or substantially linearly proportional to each other.

Since the second magnetoresistive elements 330*a* and 330*b* are arranged inside the first magnetoresistive elements 120*a* and 120*b* in the magnetic sensor 300 according to the third preferred embodiment as well, the magnetic sensor 300 is able to also be made compact. In addition, since there is no need to route the wiring lines that electrically connect the first magnetoresistive elements 120*a* and 120*b* and the second magnetoresistive elements 330*a* and 330*b* to each other in three dimensions in the magnetic sensor 300 as well, the magnetic sensor 300 is able to also be manufactured by a simple manufacturing process.

Fourth Preferred Embodiment

Hereafter, a magnetic sensor according to a fourth preferred embodiment of the present invention is described while referring to the drawings. A magnetic sensor 400 according to the fourth preferred embodiment mainly differs from the magnetic sensor 100 according to the first preferred embodiment with respect to the patterns of the first magnetoresistive elements and the second magnetoresistive elements and, therefore, repeated description of the remaining elements and features is omitted.

Figure 14:
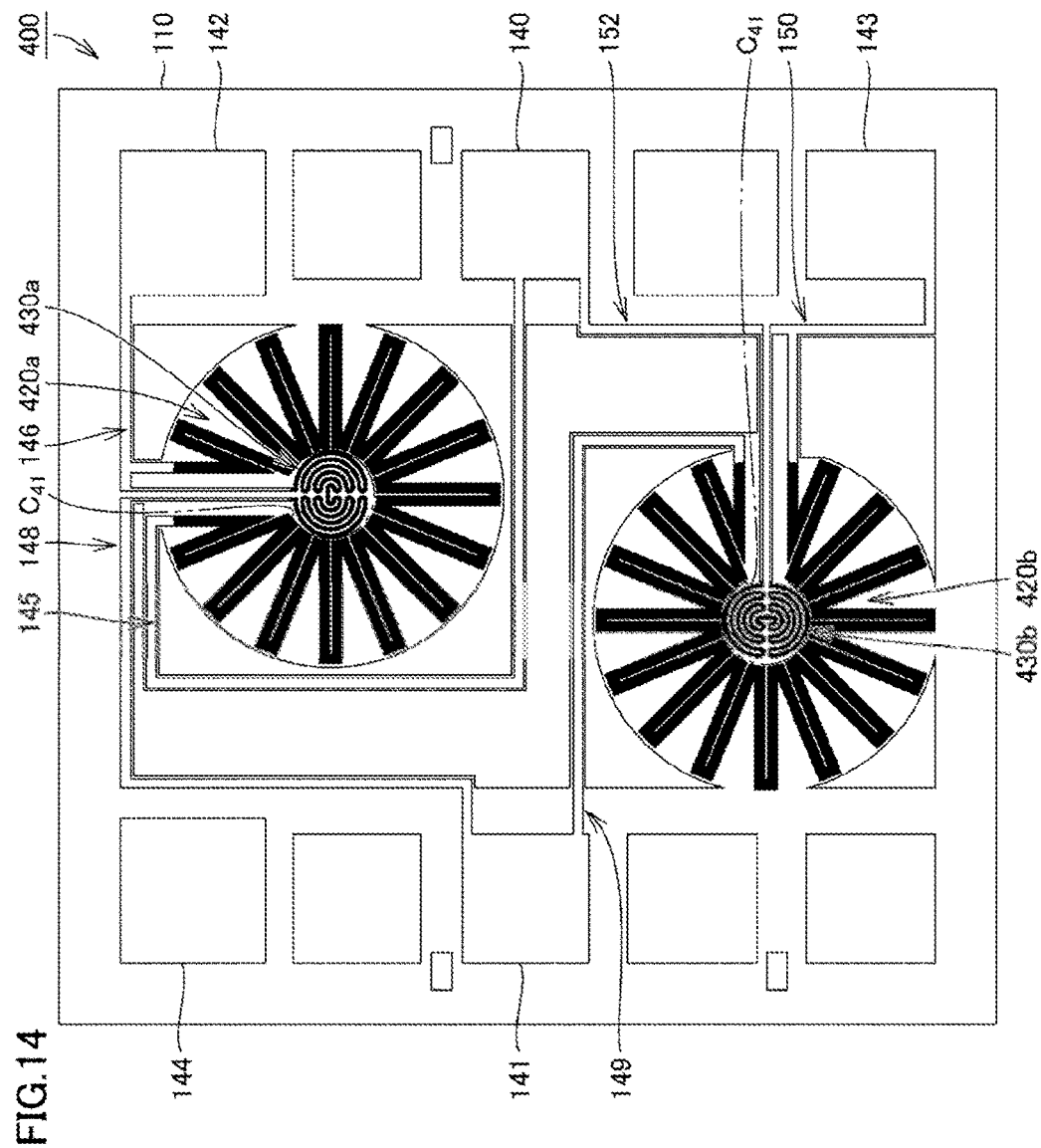
FIG. 14 is a plan view showing the patterns of four magnetoresistive elements that define a bridge circuit of a magnetic sensor according to a fourth preferred embodiment of the present invention.
Figure 15:
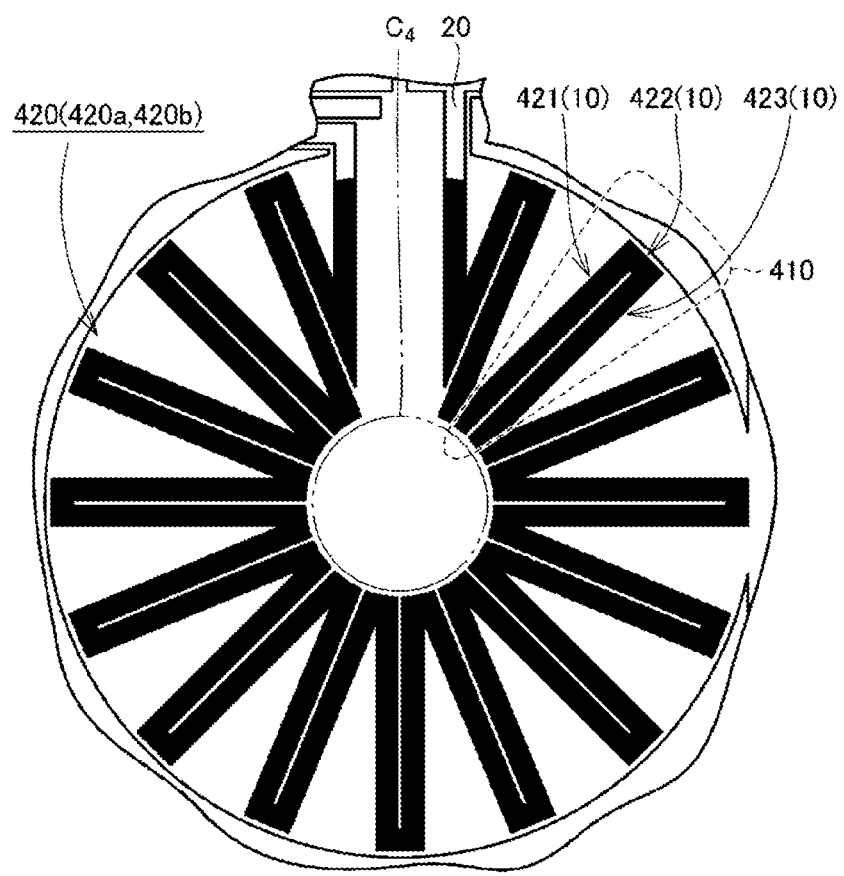
FIG. 15 is a plan view showing the pattern of a first magnetoresistive element of the magnetic sensor according to the fourth preferred embodiment of the present invention.
Figure 16:
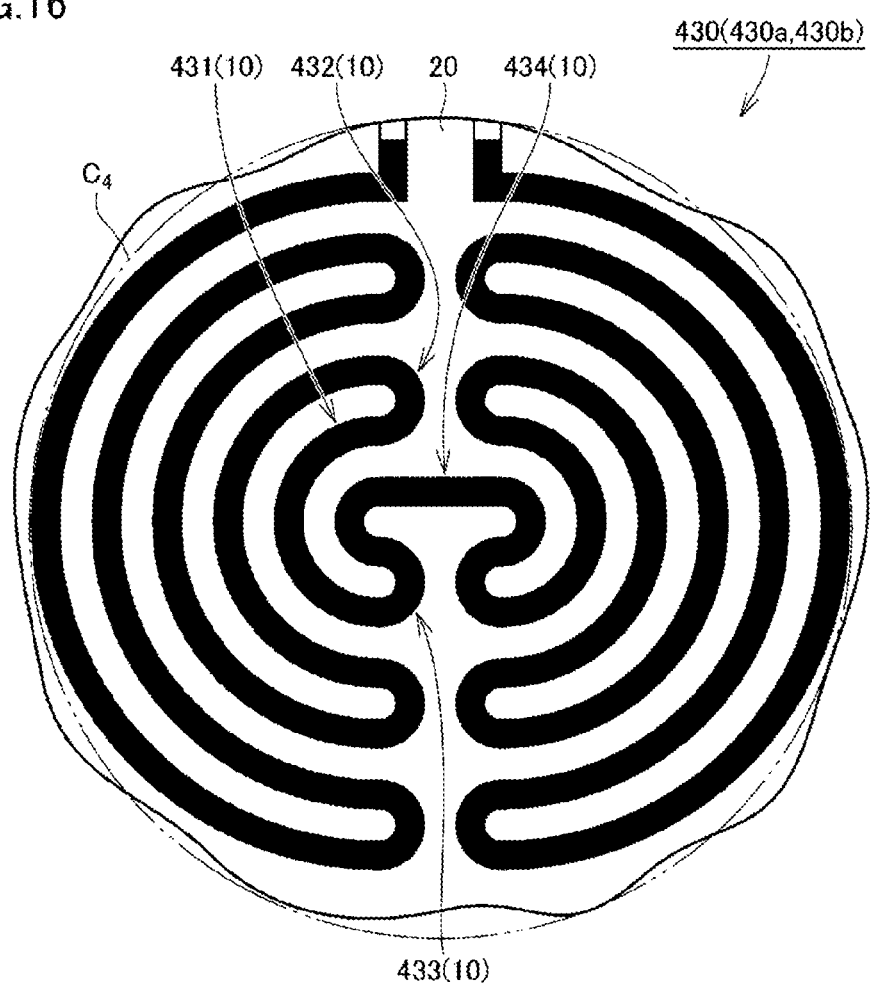
FIG. 16 is a plan view showing the pattern of a second magnetoresistive element of the magnetic sensor according to the fourth preferred embodiment of the present invention.

FIG. 14 is a plan view showing the patterns of four magnetoresistive elements that define a bridge circuit of the magnetic sensor according to the fourth preferred embodiment. FIG. 15 is a plan view showing the pattern of a first magnetoresistive element of the magnetic sensor according to the fourth preferred embodiment. FIG. 16 is a plan view showing the pattern of a second magnetoresistive element of the magnetic sensor according to the fourth preferred embodiment.

As shown in FIGS. 14 and 15, the patterns of first magnetoresistive elements 420*a* and 420*b* of the magnetic sensor 400 according to the fourth preferred embodiment each include fifteen first unit patterns 410 that are arranged, in plan view, along the circumference of an imaginary circle $C_4$. The unit patterns are arrayed in a circumferential direction of the imaginary circle $C_4$, the first unit patterns being connected to each other. The fifteen first unit patterns 410 are positioned along an imaginary C-shape $C_{41}$ including an open portion, in the circumference of the imaginary circle $C_4$, in which the wiring lines 146, 148, 150 and 152 are located. The fifteen first unit patterns 410 are folded-back-shaped patterns that are arranged in a radiating shape that radiates from the center of the imaginary circle $C_4$.

Each folded-back-shaped pattern includes linear extending portions 421 and 423 that extend in a radiating shape that radiates from the center of the imaginary circle $C_4$ with a space therebetween and a linear extending portion 422 that electrically connects a leading end of the linear extending portion 421 and a leading end of the linear extending portion 423. The linear extending portion 421 and the linear extending portion 422 are orthogonal or substantially orthogonal to each other. The linear extending portion 423 and the linear extending portion 422 are orthogonal or substantially orthogonal to each other.

As shown in FIG. 14, the two first magnetoresistive elements 420*a* and 420*b* include different orientations from each other in the circumferential direction. Accordingly, the orientations of the imaginary C-shapes $C_{41}$ are different from each other. That is, the patterns 420 of the two first magnetoresistive elements 420a and 420b include different circumferential direction orientations from each other. In the fourth preferred embodiment, the circumferential direction orientations of the patterns 420 of the two first magnetoresistive elements 420a and 420b differ by about 90°, for example.

The second magnetoresistive elements 430a and 430b of the magnetic sensor 400 according to the fourth preferred embodiment each include a pattern 430 that includes twelve semicircular arc-shaped patterns 431, which are second patterns that are line-symmetrically arranged along the circumference of the imaginary circle $C_4$ to be arrayed in a diameter direction of the imaginary circle $C_4$. The pattern 430 includes a pattern that is narrower than the pattern 420 of the first magnetoresistive elements 420a and 420b.

Among the ten semicircular arc-shaped patterns 431 that are located outside the innermost semicircular arc-shaped patterns 431, one end of every two semicircular arc-shaped patterns 431, which are adjacent to or in a vicinity of each other in order from the inside, are connected to each other by a semicircular arc-shaped pattern 432. The other end of every two C-shaped patterns 431, which are adjacent to or in a vicinity of each other in order from the inside, are connected to each other by a semicircular arc-shaped pattern 433. The one end of the line-symmetrical innermost semicircular arc-shaped patterns 431 are connected to each other by a linear extending portion 434. The length of the linear extending portion 434 is less than about 10 μm, for example.

The patterns 430 of the second magnetoresistive elements 430a and 430b each include four semicircular arc-shaped patterns 432, six semicircular arc-shaped patterns 433 and the linear extending portion 434. The twelve semicircular arc-shaped patterns 431 are thus connected in series with each other. The semicircular arc-shaped patterns 432 and 433 do not include any linear extending portions and include only curved portions.

In addition, in the magnetic sensor 400 according to the fourth preferred embodiment, the anisotropy of the magnetoresistive effect of the first magnetoresistive elements 420a and 420b is able to be reduced by varying, across the horizontal directions, the direction of the current that flows through the pattern 420 by arranging fifteen first unit patterns 410 along the circumference of the imaginary circle $C_4$.

In the magnetic sensor 400 according to the fourth preferred embodiment, the second magnetoresistive elements 430a and 430b each include semicircular arc-shaped patterns 431. Each semicircular arc-shaped pattern 431 includes a circular arc. Every two adjacent or neighboring semicircular arc-shaped patterns 431 are connected to each other by the semicircular arc-shaped patterns 432 and 433. Since the second magnetoresistive elements 430a and 430b include only the linear extending portion 434, which includes a length less than about 10 μm, for example, the anisotropy of magnetic field detection is significantly reduced or prevented.

The patterns 430 of the two second magnetoresistive elements 430a and 430b include different orientations in the circumferential direction from each other. In the fourth preferred embodiment, the circumferential direction orientations of the patterns 430 of the two second magnetoresistive elements 430a and 430b differ by about 90°, for example. Therefore, the anisotropies of the magnetoresistive effects of the two second magnetoresistive elements 430a and 430b are able to significantly reduce or cancel each other.

Since the second magnetoresistive elements 430a and 430b are arranged inside the first magnetoresistive elements 420a and 420b in the magnetic sensor 400 according to the fourth preferred embodiment as well, the magnetic sensor 400 is able to be made compact. In addition, since there is no need to route the wiring lines that electrically connect the first magnetoresistive elements 420a and 420b and the second magnetoresistive elements 430a and 430b to each other in three dimensions in the magnetic sensor 400 as well, the magnetic sensor 400 is able to be manufactured by a simple manufacturing process.

The preferred embodiments of the present invention are illustrative in all points and should not be considered as limiting. The scope of the present invention is not defined by the above description but rather by the scope of the claims and it is intended that equivalents to the scope of the claims and all modifications within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
a plurality of magnetoresistive elements that are electrically connected to each other by wiring lines to define a bridge circuit; wherein
the plurality of magnetoresistive elements includes a first magnetoresistive element and a second magnetoresistive element, which define a pair;
a rate of change of resistance of the first magnetoresistive element is higher than a rate of change of resistance of the second magnetoresistive element;
the first magnetoresistive element includes a plurality of first unit patterns that are arranged along a circumference of an imaginary circle in plan view and arrayed in a circumferential direction or a diameter direction of the imaginary circle, the first unit patterns being connected to each other;
the second magnetoresistive element is located inside the imaginary circle and surrounded by the first magnetoresistive element in plan view;
the second magnetoresistive element includes a plurality of second unit patterns that are narrower than the plurality of first unit patterns and that are connected to each other;
the second magnetoresistive element is electrically connected to a wiring line that extends from inside the imaginary circle to outside the imaginary circle;
the plurality of first unit patterns is positioned along an imaginary C-shape including an open portion, along the circumference of the imaginary circle, in which the wiring line is positioned;
the plurality of magnetoresistive elements includes two pairs of the first magnetoresistive element and the second magnetoresistive element;
circumferential direction orientations of the two first magnetoresistive elements included in the two pairs of the first magnetoresistive element and the second magnetoresistive element are different from each other; and
orientations of the imaginary C-shapes are different from each other.

2. The magnetic sensor according to claim 1, wherein the plurality of second unit patterns are semicircular arc-shaped patterns that are line-symmetrically arranged along the circumference of the imaginary circle to be arrayed in the diameter direction of the imaginary circle.

3. The magnetic sensor according to claim 1, wherein the plurality of second unit patterns are spherical patterns including a diameter of less than about 10 μm.

4. The magnetic sensor according to claim 1, wherein the plurality of first unit patterns include C-shaped patterns that are arranged along the imaginary C-shape and arrayed in the diameter direction of the imaginary circle.

5. The magnetic sensor according to claim 1, wherein the plurality of first unit patterns include folded-back-shaped patterns that are arranged in a radiating shape that radiates from a center of the imaginary circle.

6. The magnetic sensor according to claim 1, wherein an electrical resistance value of the first magnetoresistive element varies according to an externally applied magnetic field.

7. The magnetic sensor according to claim 1, wherein an electrical resistance value of the second magnetoresistive element does not substantially change when an external magnetic field is applied to the second magnetoresistive element.

8. The magnetic sensor according to claim 1, wherein the first magnetoresistive element and the second magnetoresistive element are electrically connected in series with each other by at least one of the wiring lines.

9. The magnetic sensor according to claim 1, wherein
a first pair of the first magnetoresistive element and the second magnetoresistive element is electrically connected to a first midpoint terminal of the magnetic sensor; and
a second pair of the first magnetoresistive element and the second magnetoresistive element is electrically connected to a second midpoint terminal of the magnetic sensor.

10. The magnetic sensor according to claim 9, wherein input terminals of a differential amplifier are electrically connected to the first and second midpoint terminals of the magnetic sensor.

11. The magnetic sensor according to claim 10, wherein an output terminal of the differential amplifier is electrically connected to an input terminal of a temperature compensation circuit.

12. The magnetic sensor according to claim 11, wherein an output terminal of the temperature compensation circuit is electrically connected to a latch and a switch circuit.

13. The magnetic sensor according to claim 12, wherein an output terminal of the latch and the switch circuit is electrically connected to a complementary metal oxide semiconductor driver.

14. The magnetic sensor according to claim 13, wherein an output terminal of the complementary metal oxide driver is electrically connected to an output terminal of the magnetic sensor.

15. The magnetic sensor according to claim 14, wherein
a potential difference between the first midpoint terminal and the second midpoint terminal varies according to an externally applied magnetic field; and
when the potential difference between the first midpoint terminal and the second midpoint terminal exceeds a predetermined threshold, a signal is output from the output terminal.

16. A magnetic sensor comprising:
a plurality of magnetoresistive elements that are electrically connected to each other by wiring lines to define a bridge circuit; wherein
the plurality of magnetoresistive elements include a first magnetoresistive element and a second magnetoresistive element, which define a pair;
a rate of change of resistance of the first magnetoresistive element is higher than a rate of change of resistance of the second magnetoresistive element;
the first magnetoresistive element includes a plurality of first unit patterns that are arranged along a circumference of an imaginary circle in plan view and arrayed in a circumferential direction or a diameter direction of the imaginary circle, the first unit patterns being connected to each other;
the second magnetoresistive element is located inside the imaginary circle and surrounded by the first magnetoresistive element in plan view;
the second magnetoresistive element includes a plurality of second unit patterns that are narrower than the plurality of first unit patterns and that are connected to each other;
the second magnetoresistive element includes a double-spiral-shaped pattern that includes a double spiral shape in plan view; and
the double-spiral-shaped pattern includes one spiral-shaped pattern, which is one of the plurality of second unit patterns, another spiral-shaped pattern, which another one of the plurality of second unit patterns, and an S-shaped pattern or a reverse S-shaped pattern that connects the one spiral-shaped pattern and the other spiral-shaped pattern to each other in a central portion of the double-spiral-shaped pattern.

17. A magnetic sensor comprising:
a plurality of magnetoresistive elements that are electrically connected to each other by wiring lines to define a bridge circuit; wherein
the plurality of magnetoresistive elements include a first magnetoresistive element and a second magnetoresistive element, which define a pair;
a rate of change of resistance of the first magnetoresistive element is higher than a rate of change of resistance of the second magnetoresistive element;
the first magnetoresistive element includes a plurality of first unit patterns that are arranged along a circumference of an imaginary circle in plan view and arrayed in a circumferential direction or a diameter direction of the imaginary circle, the first unit patterns being connected to each other;
the second magnetoresistive element is located inside the imaginary circle and surrounded by the first magnetoresistive element in plan view;
the second magnetoresistive element includes a plurality of second unit patterns that are narrower than the plurality of first unit patterns and that are connected to each other; and
each of the plurality of second unit patterns includes a plurality of bent portions and includes a folded back shape, and does not include a linear extending portion with a length of about 10 μm or more.

* * * * *